United States Patent
Wei et al.

(10) Patent No.: US 10,490,898 B2
(45) Date of Patent: Nov. 26, 2019

(54) ANTENNA STRUCTURE AND CIRCUIT MODULE AND ELECTRONIC DEVICE USING THE SAME

(71) Applicant: Primax Electronics Ltd., Neihu, Taipei (TW)

(72) Inventors: Shen-Pin Wei, Taipei (TW); Chun-Nan Su, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 464 days.

(21) Appl. No.: 15/157,162

(22) Filed: May 17, 2016

(65) Prior Publication Data

US 2017/0250470 A1 Aug. 31, 2017

(30) Foreign Application Priority Data

Feb. 26, 2016 (TW) .............................. 105105942 A

(51) Int. Cl.
*H01Q 9/04* (2006.01)
*H01Q 1/24* (2006.01)
*H01Q 1/48* (2006.01)
*H03H 7/38* (2006.01)

(52) U.S. Cl.
CPC ............. *H01Q 9/045* (2013.01); *H01Q 1/243* (2013.01); *H01Q 1/48* (2013.01); *H03H 7/38* (2013.01)

(58) Field of Classification Search
CPC ............................ H01Q 9/0442; H01Q 9/045
See application file for complete search history.

(56) References Cited

U.S. PATENT DOCUMENTS

| 2003/0142022 | A1* | 7/2003 | Ollikainen | ............. | H01Q 1/243 343/702 |
| 2006/0135056 | A1* | 6/2006 | Rydgren | ................ | H01R 23/70 455/1 |
| 2012/0176275 | A1* | 7/2012 | Horisawa | ............... | H01Q 1/243 343/700 MS |

* cited by examiner

*Primary Examiner* — Daniel Munoz
*Assistant Examiner* — Noel Maldonado
(74) *Attorney, Agent, or Firm* — Kirton McConkie; Evan R. Witt

(57) ABSTRACT

The present invention provides an antenna structure, including a radiation component, a short-circuit pin, a metal matching component, and a signal feed-in component, where the radiation component is disposed above a circuit board, two ends of the short-circuit pin are separately connected to the radiation component and a ground end that is on the circuit board, the metal matching component is disposed on the circuit board and is configured to change impedance of the antenna structure, two ends of the signal feed-in component are separately connected to the radiation component and the metal matching component, and a current from the circuit board sequentially flows through the metal matching component and the signal feed-in component before arriving at the radiation component, so that the radiation component transmits a radiation signal. In addition, the present invention further provides a circuit module and an electronic device using the antenna structure.

9 Claims, 8 Drawing Sheets

ANTENNA STRUCTURE AND CIRCUIT MODULE AND ELECTRONIC DEVICE USING THE SAME

FIELD OF THE INVENTION

The present invention relates to the field of wireless signal transmission, and in particular, to an antenna structure and a circuit module and an electronic device using the antenna structure.

BACKGROUND OF THE INVENTION

In recent years, with the popularity of consumer electronic products and the development of the Internet, information from different regions of the world can be fast spread and shared by people globally. In addition, the interconnection architecture of the Internet nowadays also gradually changes from a wired structure based on connection of cables, optical fibers, and the like to a wirelessly-connected structure, so as to solve the problem that the circuit layout is too complicated and at the same time provide users with a convenient and humanized communication environment.

For the wirelessly-connected structure, the wireless communications technology in which the electromagnetic wave is used to transmit a signal is also widely applied to various types of electronic devices such as notebook computers, mobile phones, wearable devices, and the like. Therefore, an antenna structure for receiving and sending electromagnetic wave signals becomes an indispensable component of the electronic devices. Currently, an antenna structure may be exposed outside an electronic device or built inside an electronic device. However, the exposed antenna structure not only affects the volume and external appearance of the electronic device, but also may be easily bent or damaged by an external force. Therefore, the built-in antenna structure has become the mainstream trend.

Refer to FIG. 1, which is a schematic structural diagram of a conventional antenna structure. The antenna structure 1 shown in FIG. 1 is a planar inverted-F antenna, and includes a radiation component 11, a short-circuit pin 12, a signal feed-in component 13, and an inductor-capacitor circuit (LC circuit) 14 disposed on a circuit board 2. In addition, two ends of the short-circuit pin 12 are separately connected to the radiation component 11 and the ground end 21 that is on the circuit board 2, two ends of the signal feed-in component 13 are separately connected to the radiation component 11 and the inductor-capacitor circuit 14, and a current from a signal processing unit 22 on the circuit board 2 flows through the signal feed-in component 13, and is transmitted to the radiation component 11, so that the radiation component 11 further transmits a radiation signal to the external. To achieve impedance matching between the antenna structure 1 and the signal processing unit 22, or to enable the antenna structure 1 to meet specifications and performance needed in actual use, a current method is to change the shape of the inductor-capacitor circuit 14 or the antenna structure 1. The antenna structure 1 shown in FIG. 1 is well known by a person skilled in the art, and therefore, details are not described herein.

However, the conventional antenna structure 1 has the following defects: first, inductance and capacitance in the inductor-capacitor circuit 14 causes an energy loss; second, for different electronic devices using the antenna structure 1, the shape of the antenna structure 1 must be changed to achieve desired performance; however, if the shape of the antenna structure 1 is too complicated, the mold used for manufacturing the antenna structure 1 also becomes more complicated, thereby increasing manufacture costs and causing difficulty to large-scale production. Therefore, the conventional antenna structure 1 needs to be improved.

SUMMARY OF THE INVENTION

An objective of the present invention is to provide an antenna structure having a metal matching component disposed on a circuit board. The antenna structure has required impedance and meets specifications by properly setting a shape of the metal matching component or a distance between the metal matching component and a ground end of the circuit board, so that an energy loss caused by an additional inductor or capacitor on the circuit board can be reduced, and a shape of the antenna structure needs less modification.

Another objective of the present invention is to provide a circuit module and an electronic device using the antenna structure.

In a preferred embodiment, the present invention provides a circuit module, including:
a circuit board, where a ground end and a signal processing unit are disposed on the circuit board; and
an antenna structure, including
a radiation component, disposed above the circuit board;
a short-circuit pin, where two ends of the short-circuit pin are separately connected to the radiation component and the ground end; a metal matching component, disposed on the circuit board and configured to change impedance of the antenna structure; and
a signal feed-in component, where two ends of the signal feed-in component are separately connected to the radiation component and the metal matching component, and a current from the signal processing unit flows through the signal feed-in component, and is transmitted to the radiation component, so that the radiation component transmits a radiation signal to the external.

In a preferred embodiment, the present invention also provides an antenna structure, including:
a radiation component, disposed above a circuit board;
a short-circuit pin, where two ends of the short-circuit pin are separately connected to the radiation component and a ground end that is on the circuit board;
a metal matching component, disposed on the circuit board and configured to change impedance of the antenna structure; and
a signal feed-in component, where two ends of the signal feed-in component are separately connected to the radiation component and the metal matching component, and a current from the circuit board flows through the signal feed-in component, and is transmitted to the radiation component, so that the radiation component transmits a radiation signal to the external.

In a preferred embodiment, the present invention also provides an electronic device, including:
a housing;
a circuit board, disposed inside the housing, where the circuit board is provided with a ground end and a signal processing unit; and
an antenna structure, disposed inside the housing and including:
a radiation component, disposed above the circuit board;
a short-circuit pin, where two ends of the short-circuit pin are separately connected to the radiation component and the ground end;

a metal matching component, disposed on the circuit board and configured to change impedance of the antenna structure; and a signal feed-in component, where two ends of the signal feed-in component are separately connected to the radiation component and the metal matching component, and a current from the signal processing unit flows through the signal feed-in component, and is transmitted to the radiation component, so that the radiation component transmits a radiation signal to the external.

DETAILED DESCRIPTION OF THE PREFERRED EMBODIMENT

Figure 1:
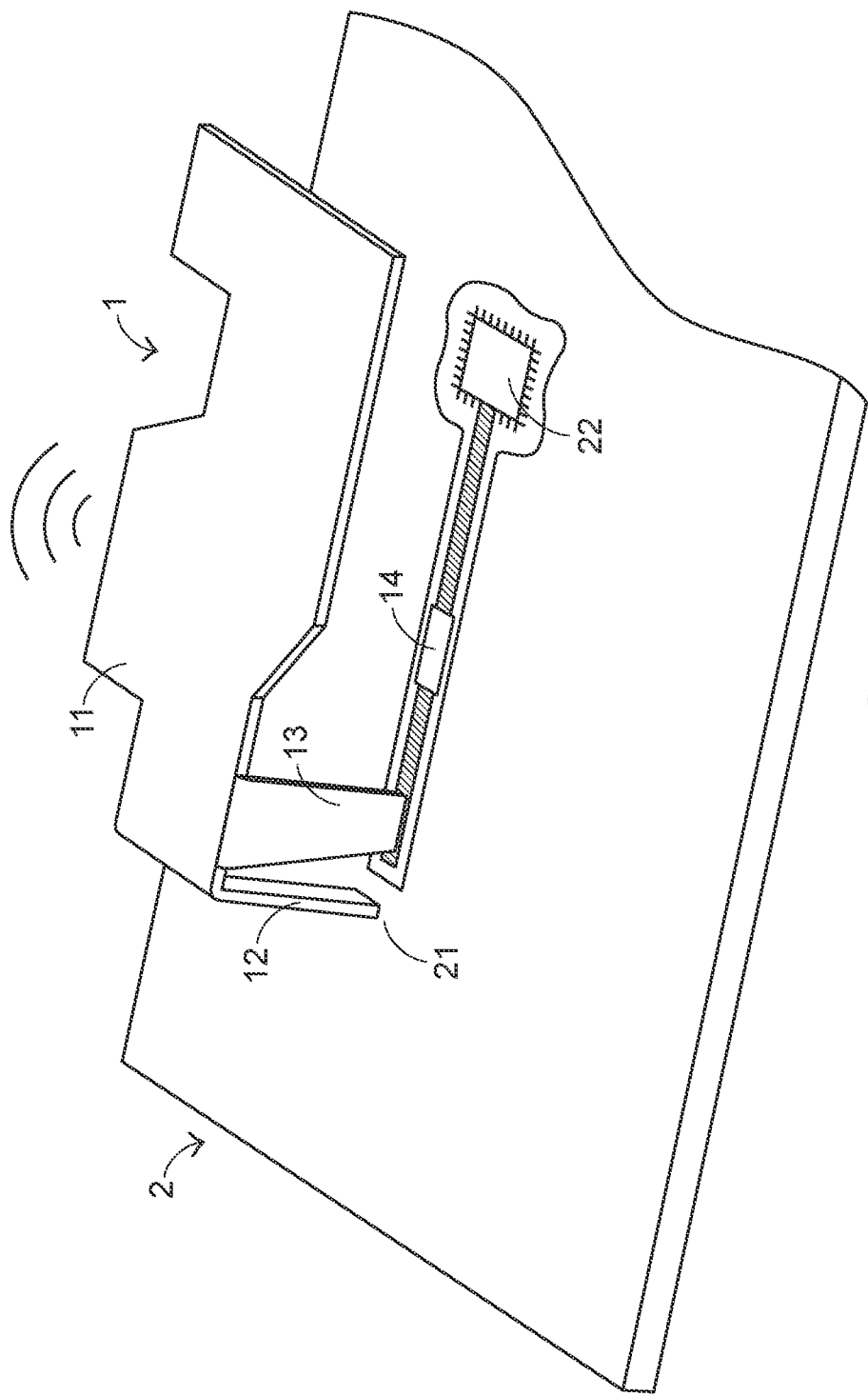
FIG. 1 is a schematic structural diagram of a conventional antenna structure.
Figure 2:
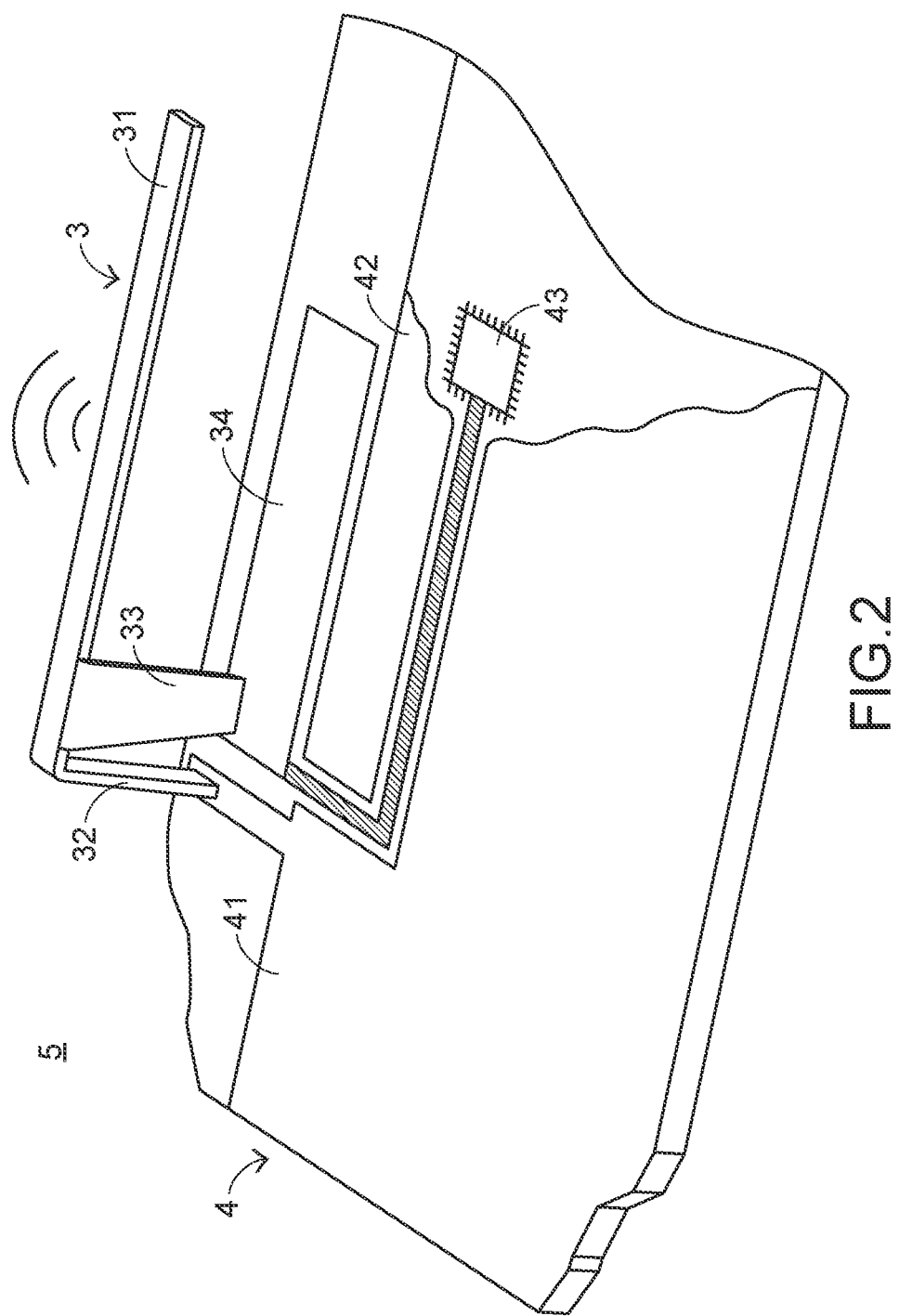
FIG. 2 is a schematic structural diagram of a preferred embodiment of a circuit module and an antenna structure thereof according to the present invention.

Refer to FIG. 2, which is a schematic structural diagram of a preferred embodiment of a circuit module and an antenna structure thereof according to the present invention. To describe the present invention of this application more clearly, only components described in the following are drawn in a circuit board 4 shown in FIG. 2. A circuit module 5 includes a circuit board 4 and an antenna structure 3. The circuit board 4 is provided with multiple ground ends 41 and 42 and a signal processing unit 43. The antenna structure 3 includes a radiation component 31, a short-circuit pin 32, a signal feed-in component 33, and a metal matching component 34 that is disposed on the circuit board 4. The radiation component 31 is disposed above the circuit board 4, and two ends of the short-circuit pin 32 are separately connected to the radiation component 31 and one ground end 41 that is on the circuit board 4. Two ends of the signal feed-in component 33 are separately connected to the radiation component 31 and the metal matching component 34. Therefore, a current from the signal processing unit 43 can sequentially flow through the metal matching component 34 and the signal feed-in component 33, and then be transmitted to the radiation component 31, so that the radiation component 31 further transmits a radiation signal to the external.

In this preferred embodiment, the antenna structure 3 is a planar inverted-F antenna, and the metal matching component 34 is a copper foil formed on the circuit board 4. The metal matching component 34 is not in contact with any of the ground ends 41 and 42. Therefore, after the circuit board 4 is connected to power, for any ground end 42 a distance between which and the metal matching component 34 is within an effective coupling distance will have electronic coupling with the metal matching component 34, and the effect brought by the electronic coupling is different as the shape of the metal matching component 34 changes, and is also different as a distance between the metal matching component 34 and the ground end 42 changes.

Based on this, in this application, the shape of the metal matching component 34 is changed or the distance between the metal matching component 34 and the ground end 42 is changed, so that the effect caused by the electronic coupling between the metal matching component 34 and the ground end 42 is changed, and impedance matching between the antenna structure 3 and the signal processing unit 43 is achieved. In this way, the current from the signal processing unit 43 may be better transmitted to the antenna structure 3, thereby improving antenna efficiency. Generally, a matching value of the impedance is 50 ohms but is not limited to this. In addition, in this application, the antenna structure 3 can meet specifications needed in actual use by adjusting the shape of the metal matching component 34 or adjusting the distance between the metal matching component 34 and the ground end 42.

Figure 3:
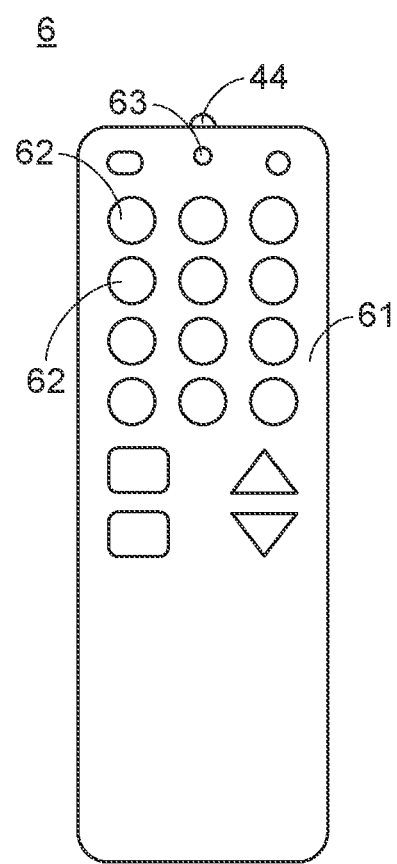
FIG. 3 is a schematic structural diagram of an external appearance of a preferred embodiment of an electronic device according to the present invention.
Figure 4:
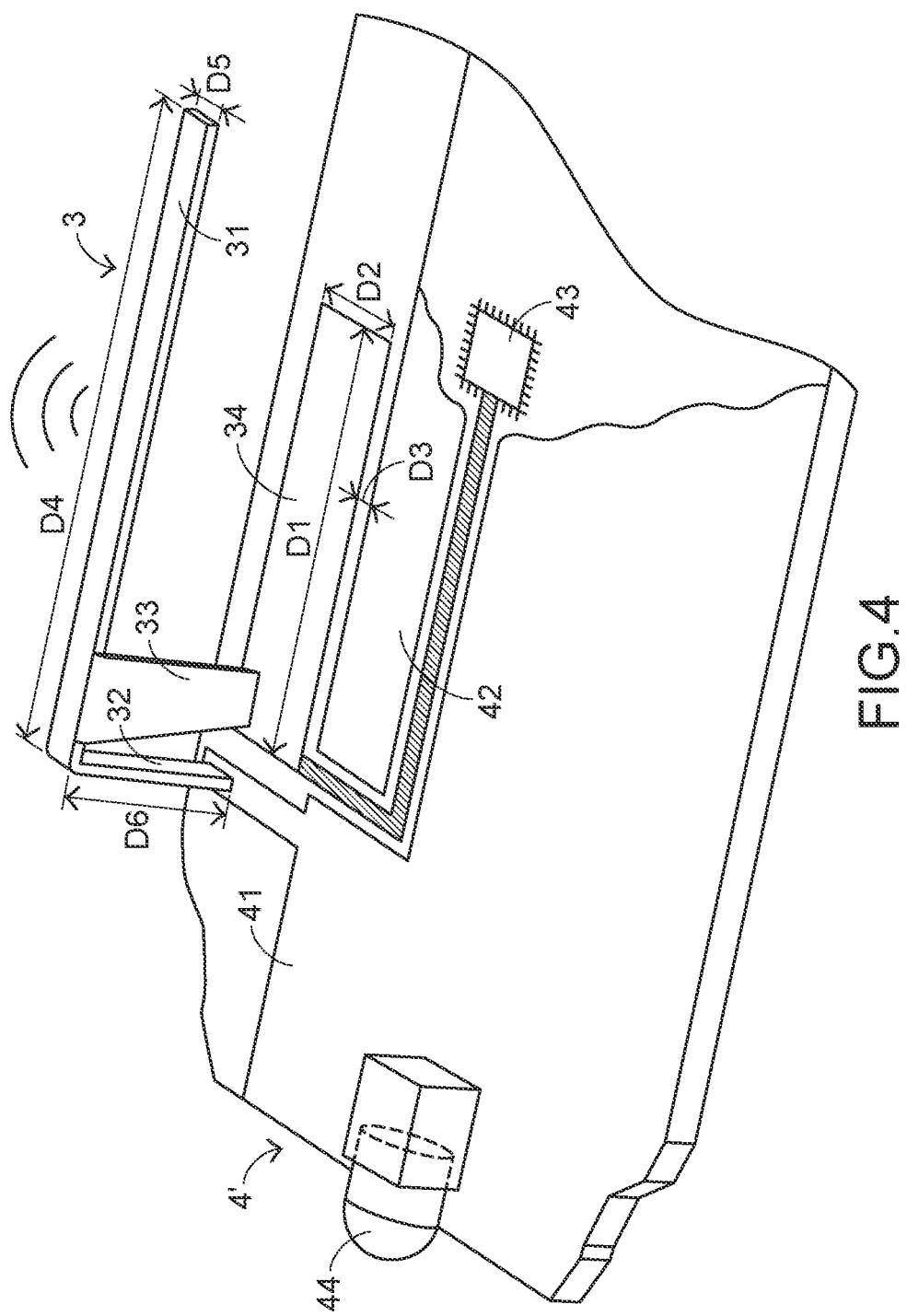
FIG. 4 is a schematic structural diagram of a part of a circuit module of the electronic device shown in FIG. 3.

The following further describes the present invention by using "the circuit module 5 shown in FIG. 2 applied in an electronic device". First, refer to FIG. 3 and FIG. 4. FIG. 3 is a schematic structural diagram of an external appearance of a preferred embodiment of an electronic device according to the present invention, and FIG. 4 is a schematic structural diagram of a part of a circuit module of the electronic device shown in FIG. 3. An electronic device 6 includes a housing 61 and a circuit board 4' and the antenna structure 3 that are disposed in the housing 61. In this preferred embodiment, the electronic device 6 is a remote controller of a remote device, and for a remote device 7 described herein (refer to FIGS. 5 and 6), a television is used as an example. Therefore, the electronic device 6 further includes multiple buttons 62 exposed outside the housing 61. A voice pickup hole 63 is arranged in the housing 61, so as to transmit a voice of a user to the circuit board 4. However, the foregoing descriptions are not intended to limit the present invention.

Further, the circuit board 4' and the antenna structure 3 of the electronic device 6 are approximately similar to what is shown in FIG. 2, and details are not described herein again. The difference lies in that the circuit board 4' is further provided with an infrared transmitter 44 partially exposed outside the housing 61, and the infrared transmitter 44 is configured to transmit an infrared signal in response to an operation of the user. In addition, in this preferred embodiment, the signal processing unit 43 on the circuit board 4' is a voice processing unit and is configured to perform signal processing on the voice of the user.

Figure 5:
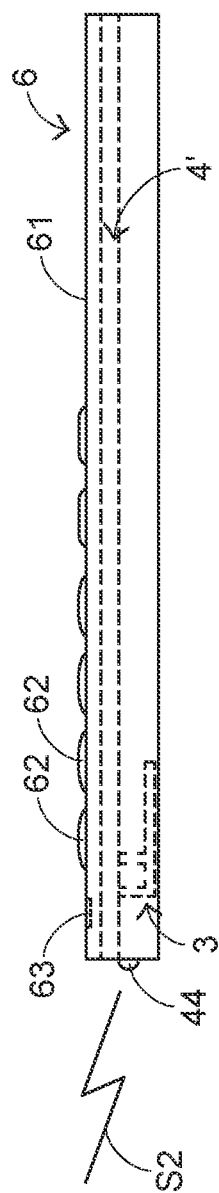
FIG. 5 is a schematic diagram of a preferred scenario in which a user operates the electronic device shown in FIG. 3.
Figure 5:
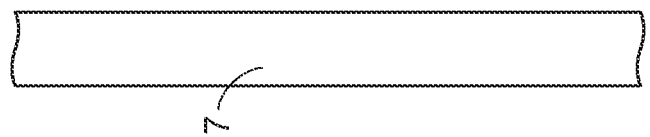

For details, refer to FIG. 5, which is a schematic diagram of a preferred scenario in which a user operates the electronic device shown in FIG. 3. When the user intends to control the remote device 7 (the television) remotely, the user may first point the infrared transmitter 44 of the electronic device 6 (the remote controller) to the remote device 7 (the television), and presses buttons 62 of the remote controller so that the infrared transmitter 44 transmits a corresponding infrared signal S2 to the remote device 7 (the television), thereby remotely controlling the remote device 7 (the television).

Figure 6:
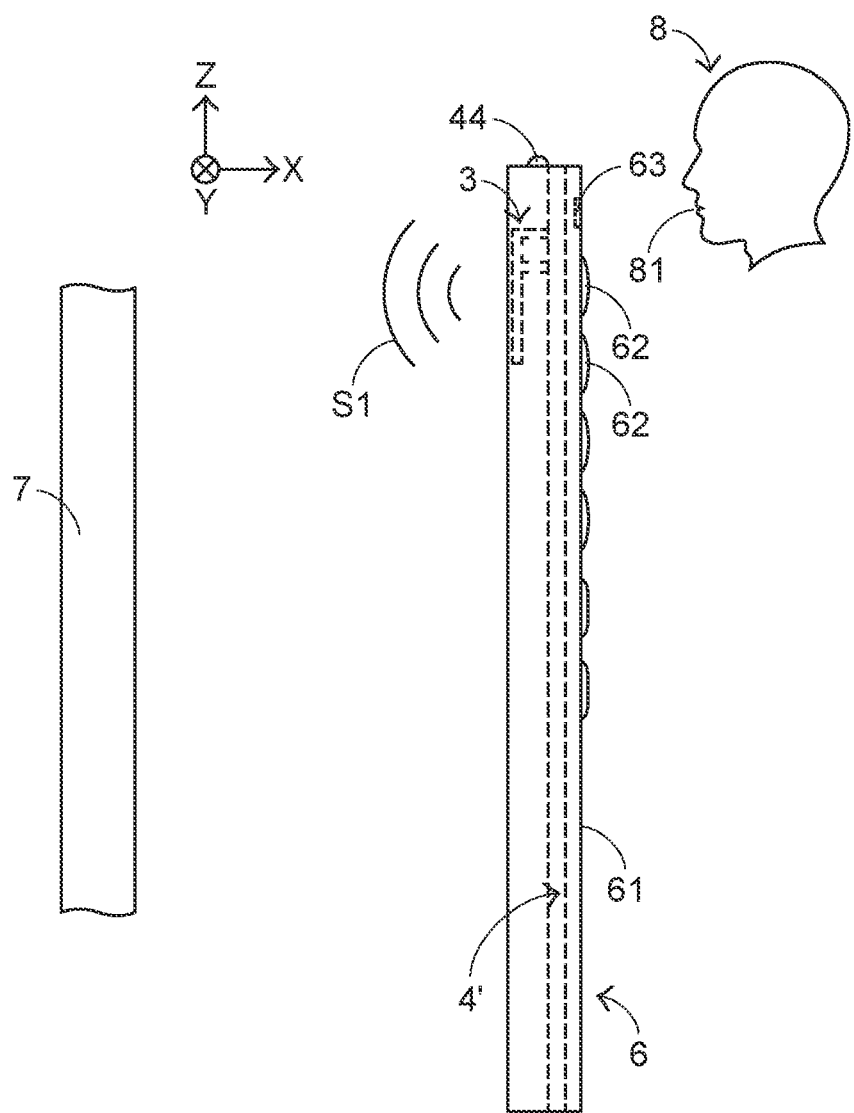
FIG. 6 is a schematic diagram of another preferred scenario in which a user operates the electronic device shown in FIG. 3.

Further, refer to FIG. 6, which is a schematic diagram of another preferred scenario in which a user operates the electronic device shown in FIG. 3. The electronic device 6 (the remote controller) further provides a voice control function. Therefore, when a user 8 intends to control the remote device 7 (the television) remotely, the user may first aim the mouth 81 at the voice pickup hole 63 in the housing 61 of the electronic device 6 (the remote controller), and then give an instruction in a voice manner. The voice of the user 8 is transmitted to the circuit board 4' through the voice pickup hole 63. In this case, the signal processing unit 43 on the circuit board 4' performs signal processing on the voice of the user 8, so that the corresponding current is output from the signal processing unit 43, flows through the metal matching component 34 and the signal feed-in component 33 of the antenna structure 3 sequentially, and then is transmitted to the radiation component 31, so that the radiation component 31 transmits a corresponding radiation signal S1 to the remote device 7 (the television), thereby controlling the remote device 7 (the television) remotely.

It should be noted that, as shown in FIG. 4 again, to improve the antenna efficiency of the antenna structure 3 and meet an actual application requirement, in this preferred embodiment, the shape of the metal matching component 34 of the antenna structure 3 is designed as a stripe rectangular shape of D1*D2, and a distance between the metal matching component 34 and the ground ends 41 and 42 of the circuit board 4 is designed as D3. The shape of the radiation component 31 is D4*D5, and the height of the radiation component 31 above the circuit board 4 is D6, where D1=15.5 mm, D2=2.95 mm, D3=0.5 mm, D4=24.2 mm, D5=2 mm, and D6=6.5 mm.

Figure 7:
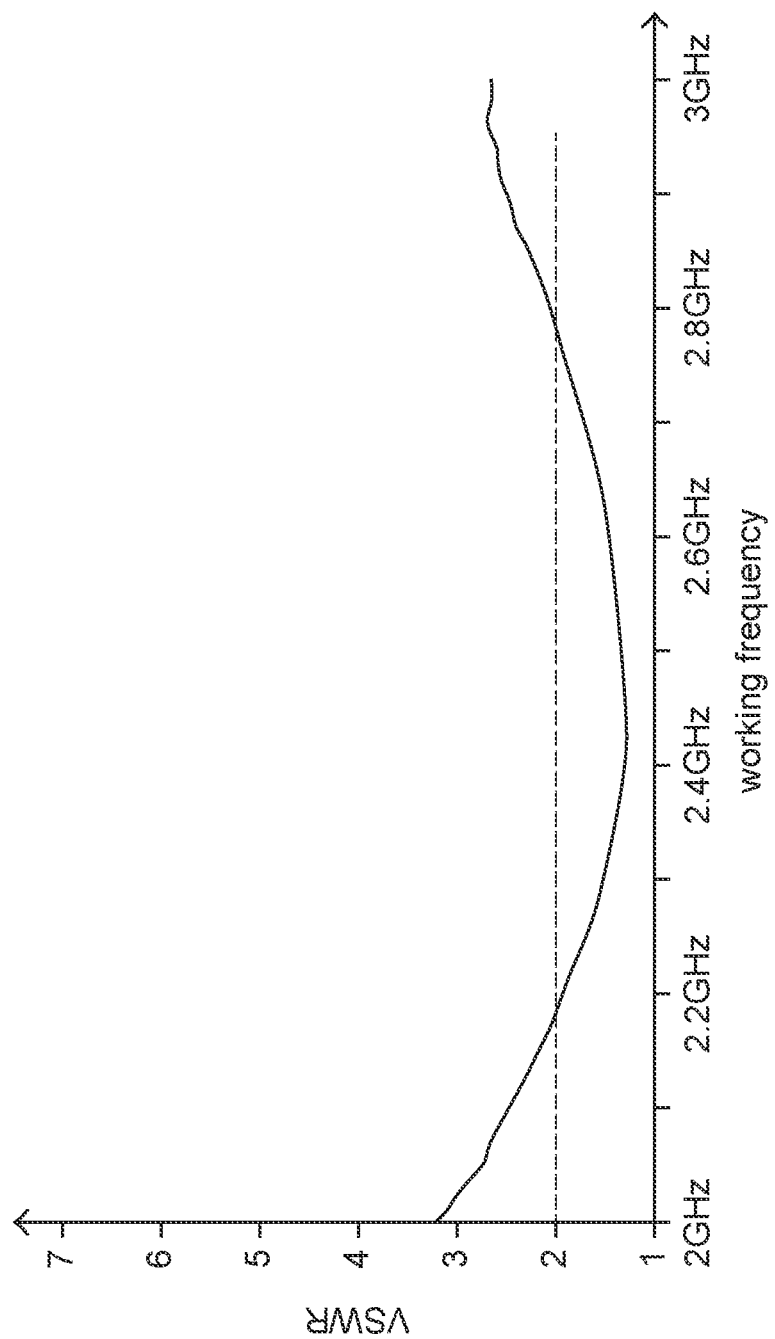
FIG. 7 is a schematic diagram of a relationship between a working frequency (a horizontal axis) and a voltage standing wave ratio (a vertical axis) of an antenna structure of the electronic device shown in FIG. 3.

Subsequently, specifications to which the antenna structure 3 of the foregoing design conforms are described with reference to FIG. 7 and FIG. 8. Refer to FIG. 7, which is a schematic diagram of a relationship between a working frequency (a horizontal axis) and a voltage standing wave ratio (a vertical axis) of an antenna structure of the electronic device shown in FIG. 3. FIG. 7 shows that a voltage standing wave ratio (VSWR) of the antenna structure 3 when the working frequency is between 2.2 GHz and 2.8 GHz meets a requirement of being lower than 2 in the industry, which also reflects that the antenna structure 3 has a relatively large operable antenna bandwidth.

Figure 8:
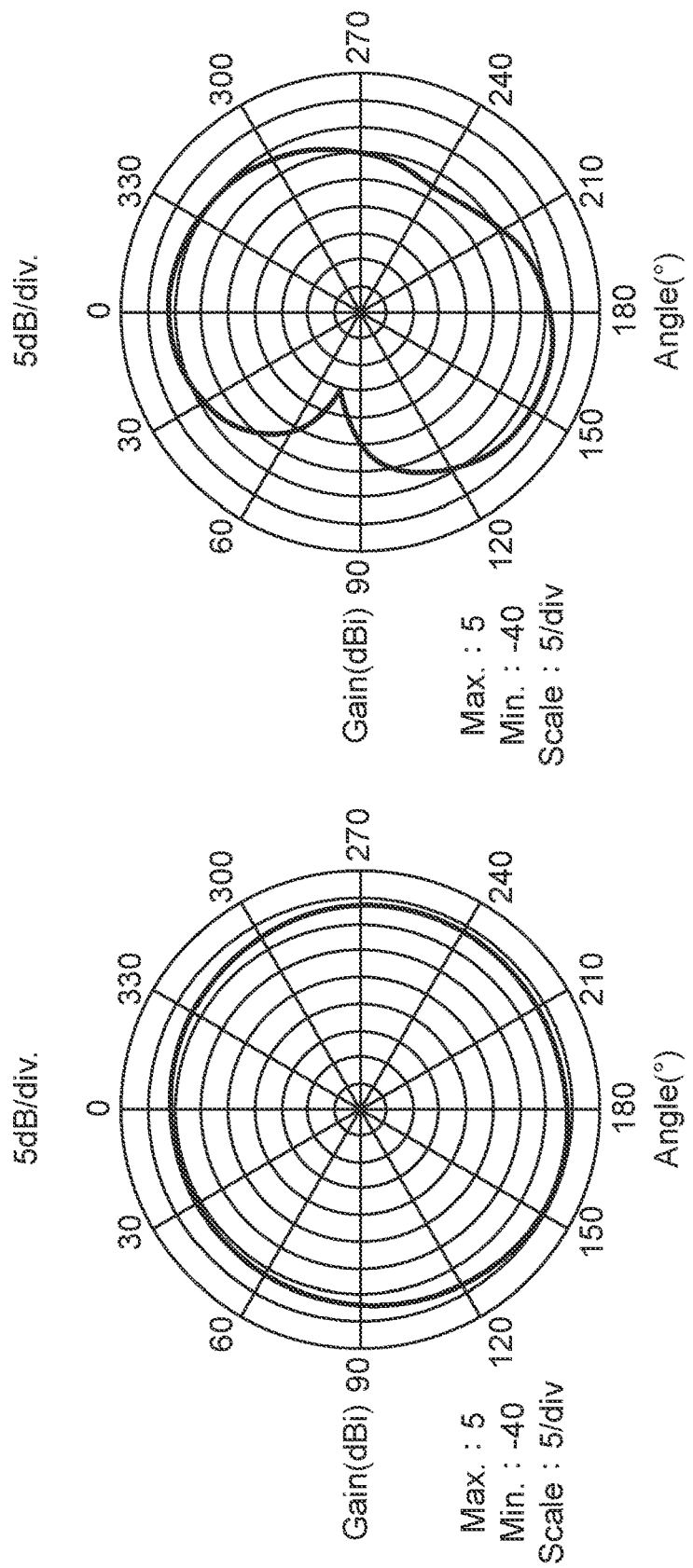
FIG. 8 is a schematic diagram of a radiation field shape, in an XY plane, of an antenna structure of the electronic device shown in FIG. 3.

Further, refer to FIG. 6 and FIG. 8. FIG. 8 is a schematic diagram of a radiation field shape, in an XY plane, of an antenna structure of the electronic device shown in FIG. 3. The XY plane is as defined in FIG. 6. FIG. 6 and FIG. 8 show that the antenna structure 3 has a good radiation field shape in a direction towards the remote device 7 (the television). It is well known by a person skilled in the art to interpret FIG. 7 and FIG. 8, and details are not described herein again. In addition, after an actual test, related experiment data of the antenna structure 3 based on the foregoing design is as shown in the following table. Moreover, the experiment data is obtained from experiments conducted by certified LAB: ETS Lindgren SYSTEM CTIA Certification, OTA3, ADT). It may be learned from the experiment data that all antenna efficiencies are larger than 70% when the working frequency is between 2.402 GHz and 2.480 GHz.

| Frequency | 2.402 GHz | 2.440 GHz | 2.480 GHz |
|---|---|---|---|
| Directivity | −4.30 dBi | −4.72 dBi | −5.14 dBi |
| Efficiency | 1.52 dB | 1.31 dB | 1.14 dB |
| Efficiency | 70.49% | 73.98% | 76.84% |

It may be known from the above descriptions that, to change impedance of the antenna structure 3 and enable the antenna structure 3 to meet specifications needed in actual use, it is only needed to adjust the shape of the metal matching component 34 disposed on the circuit board 4' or the distance between the metal matching component 34 and the ground end 42 of the circuit board 4'. Therefore, the antenna structure 3 in this application has the following advantages: first, the inductor-capacitor circuit is not used, so an energy loss caused by inductance or capacitance is prevented; second, the shape of the radiation component 31, the short-circuit pin 32, or the signal feed-in component 33 of the antenna structure 3 does not need significant change when the antenna structure 3 is used in different electronic devices, so as to reduce manufacture costs.

The foregoing descriptions are merely preferred embodiments of the present invention and are not intended to limit the protection scope of the present invention. Therefore, any equivalent change or modification without departing from the spirit of the present invention shall all fall within the protection scope of this application.

What is claimed is:

1. A circuit module, comprising:
   a circuit board, wherein a first ground end, a second ground end, and a signal processing unit are disposed on the circuit board; and
   an antenna structure, comprising
      a radiation component, disposed above the circuit board;
      a short-circuit pin, wherein two ends of the short-circuit pin are separately connected to the radiation component and the ground end;
      a metal matching component, disposed on the circuit board and configured to change impedance of the antenna structure, wherein the metal matching component is connected to the signal processing unit and is not in contact with any of the first ground end and the second ground end and wherein the impedance of the antenna structure is changed by changing the shape of the metal matching component or the distance between the metal matching component and the second ground end so that an impedance matching between the antenna structure and the signal processing unit is achieved; and
      a signal feed-in component, wherein two ends of the signal feed-in component are separately connected to the radiation component and the metal matching component, and a current from the signal processing unit flows through the metal matching component and the signal feed-in component, and is transmitted to the radiation component, so that the radiation component transmits a radiation signal to the external.

2. The circuit module according to claim 1, wherein the metal matching component is a copper foil formed on the circuit board.

3. The circuit module according to claim 1, wherein the metal matching component is stripe-shaped.

4. The circuit module according to claim 1, wherein the antenna structure is a planar inverted-F antenna.

5. An electronic device, comprising: a housing;
   a circuit board, disposed inside the housing, wherein the circuit board is provided with a first ground end, a second ground end, and a signal processing unit; and
   an antenna structure, disposed inside the housing and comprising:

a radiation component, disposed above the circuit board;

a short-circuit pin, wherein two ends of the short-circuit pin are separately connected to the radiation component and the ground end;

a metal matching component, disposed on the circuit board and configured to change impedance of the antenna structure, wherein the metal matching component is connected to the signal processing unit and is not in contact with any of the first ground end and the second ground end and wherein the impedance of the antenna structure is changed by changing the shape of the metal matching component or the distance between the metal matching component and the second ground end so that an impedance matching between the antenna structure and the signal processing unit is achieved; and a signal feed-in component, wherein two ends of the signal feed-in component are separately connected to the radiation component and the metal matching component, and a current from the signal processing unit flows through the metal matching component and the signal feed-in component, and is transmitted to the radiation component, so that the radiation component transmits a radiation signal to the external.

6. The electronic device according to claim 5, wherein the electronic device is a remote controller of a remote device.

7. The electronic device according to claim 6, further comprising an infrared transmitter, disposed on the circuit board and at least partially exposed outside the housing, wherein the infrared transmitter is configured to transmit an infrared signal to the remote device.

8. The electronic device according to claim 5, wherein the metal matching component is a copper foil formed on the circuit board.

9. The electronic device according to claim 5, wherein the antenna structure is a planar inverted-F antenna.

* * * * *